United States Patent
Tailliet

(10) Patent No.: US 9,514,820 B2
(45) Date of Patent: Dec. 6, 2016

(54) EEPROM ARCHITECTURE WHEREIN EACH BIT IS FORMED BY TWO SERIALLY CONNECTED CELLS

(71) Applicant: STMicroelectronics (Rousset) SAS, Rousset (FR)

(72) Inventor: Francois Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 14/547,199

(22) Filed: Nov. 19, 2014

(65) Prior Publication Data
US 2016/0141032 A1    May 19, 2016

(51) Int. Cl.
| G11C 16/00 | (2006.01) |
| G11C 16/04 | (2006.01) |
| G11C 16/14 | (2006.01) |
| H01L 27/115 | (2006.01) |
| G11C 29/08 | (2006.01) |
| G11C 16/08 | (2006.01) |
| G11C 16/10 | (2006.01) |
| G11C 29/50 | (2006.01) |

(52) U.S. Cl.
CPC ....... *G11C 16/0483* (2013.01); *G11C 16/0441* (2013.01); *G11C 16/08* (2013.01); *G11C 16/10* (2013.01); *G11C 16/14* (2013.01); *G11C 29/08* (2013.01); *G11C 29/50004* (2013.01); *H01L 27/11524* (2013.01)

(58) Field of Classification Search
None
See application file for complete search history.

(56) References Cited

U.S. PATENT DOCUMENTS

| 7,006,381 | B2 | 2/2006 | Dormans et al. | |
| 7,450,422 | B2 * | 11/2008 | Roohparvar | G11C 16/0483 365/185.17 |
| 7,663,927 | B2 | 2/2010 | Palumbo et al. | |
| 8,335,108 | B2 * | 12/2012 | Lee | G11C 11/5621 365/185.17 |
| 8,750,041 | B2 * | 6/2014 | Georgescu | G11C 16/0458 257/315 |

(Continued)

OTHER PUBLICATIONS

Aziza, Hassen et al: "Device and Memory Array Models for Flash EEPROM Technology," WSEAS Transactions on Circuits and Systems, ISSN 1109-2734, Issue 4, vol. 7, Apr. 2008, pp. 249-258).

*Primary Examiner* — Kretelia Graham
(74) *Attorney, Agent, or Firm* — Gardere Wynne Sewell, LLP

(57) ABSTRACT

An integrated circuit memory includes memory cells arranged in an array with rows and columns, each column including a first bit line and a second bit line. Each memory cell is formed by: a first select transistor with a first source-drain path; a second select transistor with a second source-drain path; a first floating gate transistor with a third source-drain path; and a second floating gate transistor with a fourth source-drain path. The first, second, third and fourth source-drain paths are coupled in series between the first bit line and the second bit line. The word line for each row of the memory is coupled to the gate terminals of the first and second select transistors. The control gate line for each row in coupled to the gate terminals of the first and second floating gate transistors.

31 Claims, 6 Drawing Sheets

(56) References Cited

U.S. PATENT DOCUMENTS

| | | | |
|---|---|---|---|
| 2006/0256618 A1* | 11/2006 | Nazarian | G11C 16/0491 365/185.17 |
| 2009/0003074 A1* | 1/2009 | Georgescu | G11C 16/0433 365/185.18 |
| 2010/0039858 A1* | 2/2010 | Maccarrone | G11C 16/0483 365/185.03 |

* cited by examiner

US 9,514,820 B2

EEPROM ARCHITECTURE WHEREIN EACH BIT IS FORMED BY TWO SERIALLY CONNECTED CELLS

TECHNICAL FIELD

The present invention relates to integrated circuit memory devices and, more particularly, to an electrically-erasable programmable read only memory (EEPROM) device.

BACKGROUND

Reference is made to FIG. 1 showing a conventional memory cell 10 for a non-volatile memory of the electrically-erasable programmable read only memory (EEPROM) type. The cell 10 is formed of two transistors coupled in series with each other between a bit line (BL) and a source node (S). A first transistor of the cell 10 is referred to as a select transistor 12. A second transistor of the cell 10 is referred to as a floating gate transistor 14. The transistors 12 and 14 are field effect transistor (FET) devices, preferably of the n conductivity type. The source-drain paths of the two transistors 12 and 14 are connected in series. A first conduction node (source or drain) of transistor 12 is connected to the bit line BL and a second conduction node (drain or source) of transistor 12 is connected to an intermediate node 16. A first conduction node (source or drain) of transistor 14 is connected to the intermediate node 16 and a second conduction node (drain or source) of transistor 14 is connected to a source (S) line. The gate of the select transistor 12 is coupled to a word line (WL) and the gate of the floating gate transistor is coupled to a control gate (CG) line.

Reference is now made to FIG. 2. To form a memory 20, a plurality of the memory cells 10 (see, FIG. 1) are arranged in an array format to form a plurality of columns 22 and a plurality of rows 24. The first conduction nodes of transistors 12 in a given column 22 are connected to a same bit line BL. The second conduction nodes of transistors 14 for an adjacent pair of cells 10 in adjacent rows 24 are connected to a common source node S line. The gates of the select transistors 12 for the cells 10 in a given row 24 are coupled to a same word line WL. Likewise, the gates of the floating gate transistors 14 for the cells 10 in that same given row 24 are coupled to a same control gate CG line. The parenthetical number (for example, (0) or (1)) after the references in FIG. 2 indicates the identification of the particular row or column.

The portion of the memory 20 illustrated in FIG. 2 includes four cells 10 and thus is configured to store four bits of data (with two columns using bit lines BL(0) and BL(1) and two rows with word lines WL(0) and WL(1) and control gate lines CG(0) and CG(1)). The " . . . " designations in the illustration are intended to show that the memory 20 may include many more cells extending in horizontal and vertical directions for a number of rows and columns.

Data retention in the memory 20 is a significant concern. It is well known to those skilled in the art that the floating gate transistor 14 in a given memory cell 10 may, over time, degrade to the point where it does not consistently operate properly or may even fail completely. The floating gate transistor 14 typically fails because it loses its ability to store (or maintain storage over time of) charge. In this condition, the cell 10 may be said to have an undetermined logic state (centered sensing) or may always read in a same state (where the sensing is not centered).

To address this issue, it is known in the art for the memory 20 to include error correction capabilities. It is also known in the art for the memory 20 to include redundant rows and columns which may be utilized in place of a row or column containing a failed or defective cell. It is also known in the art to provide redundant cells, for example, two cells per bit, so that if one cell is defective the other cell can still provide the memory storage operation. Memory designs which utilize multiple cells per bit (in either a serial connection or parallel connection) have a number of known drawbacks.

SUMMARY

In an embodiment, an integrated circuit comprises: a first bit line; a second bit line; and a first memory cell. The memory cell comprises: a first select transistor; a second select transistor; a first floating gate transistor; and a second floating gate transistor; wherein source-drain paths of the first and second select transistors and first and second floating gate transistors are coupled in series with each other between the first bit line and the second bit line.

In an embodiment, an integrated circuit comprises: a non-volatile memory including a plurality of memory cells arranged in an array with rows and columns; wherein each column includes a first bit line and a second bit line. Each memory cell comprises: a first select transistor with a first source-drain path; a second select transistor with a second source-drain path; a first floating gate transistor with a third source-drain path; and a second floating gate transistor with a fourth source-drain path; wherein the first, second, third and fourth source-drain paths are coupled in series between the first bit line and the second bit line.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
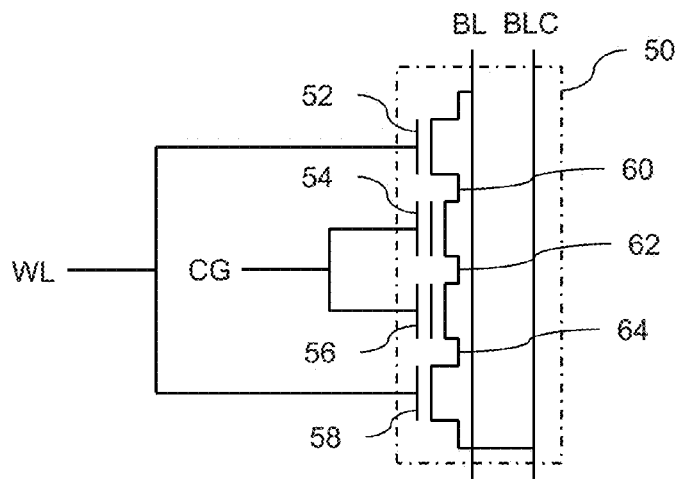
FIG. 3 is a schematic diagram of an embodiment for an EEPROM cell.

Reference is now made to FIG. 3 showing a memory cell 50 for a non-volatile memory of the electrically-erasable programmable read only memory (EEPROM) type. The cell 50 is formed of four transistors coupled in series with each other between a bit line (BL) and a complementary bit line (BLC). A first transistor of the cell 50 is referred to as a first select transistor 52. A second transistor of the cell 50 is referred to as a first floating gate transistor 54. A third transistor of the cell 50 is referred to as a second floating gate transistor 56. A fourth transistor of the cell 50 is referred to as a second select transistor 58. The transistors 52-58 are field effect transistor (FET) devices, preferably of the n conductivity type. The source-drain paths of the transistors 52 and 58 are connected in series. A first conduction node (source or drain) of transistor 52 is connected to the bit line BL and a second conduction node (drain or source) of transistor 52 is connected to a first intermediate node 60. A first conduction node (source or drain) of transistor 54 is connected to the first intermediate node 60 and a second conduction node (drain or source) of transistor 54 is connected to a second intermediate node 62. A first conduction node (source or drain) of transistor 56 is connected to the second intermediate node 62 and a second conduction node (drain or source) of transistor 56 is connected to a third intermediate node 64. A first conduction node (source or drain) of transistor 58 is connected to the third intermediate node 64 and a second conduction node (drain or source) of transistor 58 is connected to the complementary bit line BLC. The gates of the first and second select transistors 52 and 58 are coupled to a word line (WL) and the gates of the first and second floating gate transistors 54 and 56 are coupled to a control gate (CG).

Figure 4:
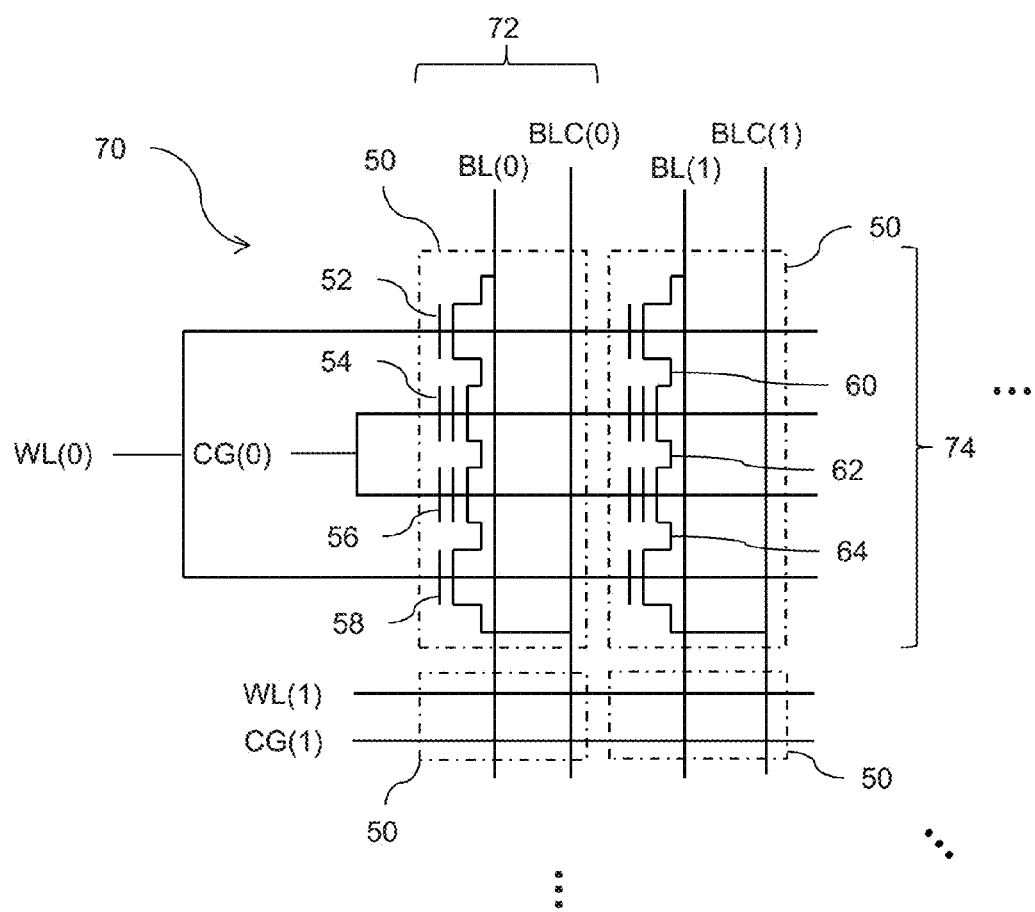
FIG. 4 is a schematic diagram of an EEPROM memory architecture using the cell of FIG. 3.

Reference is now made to FIG. 4. To form a memory 70, a plurality of the memory cells 50 (see, FIG. 3) are arranged in an array format to form a plurality of columns 72 and a plurality of rows 74. The first conduction nodes of transistors 52 in a given column 72 are connected to a same bit line BL. The second conduction nodes of transistors 58 in that same given column 72 are connected to a same complementary bit line BLC. The gates of the select transistors 52 and 58 for the cells 50 in a given row 74 are coupled to a same word line WL. Likewise, the gates of the floating gate transistors 54 and 56 for the cells 50 in that same given row 74 are coupled to a same control gate CG line. The parenthetical number (for example, (0) or (1)) after the references in FIG. 4 indicates the identification of the particular row or column.

The portion of the memory 70 illustrated in FIG. 4 includes four cells 50 and thus is configured to store four bits of data (with two columns using bit lines BL(0)/BLC(0) and BL(1)/BLC(1) and two rows with word lines WL(0) and WL(1) and control gate lines CG(0) and CG(1)). The "..." designations in the illustration are intended to show that the memory 70 may include many more cells extending in horizontal and vertical directions for a number of rows and columns.

Operation of the memory 70 to erase the cell 50 in an erase mode of memory operation is as follows: a voltage sufficient to turn on the select transistors 52 and 58 (for example, 1-5V) is applied by a memory control circuit (reference 200, FIGS. 8-9) to the word line WL of the row 74 where the selected memory cell 50 is located; the memory control circuit 200 further causes the bit line BL and complementary bit line BLC of the column 72 where the selected memory cell 50 is located to be driven to a logic low state (for example, by applying a zero voltage); a high erase voltage (for example, 13V) is applied by the control circuit 200 to the control gate CG of the row 74 where the selected memory cell 50 is located for application to the floating gate transistors 54 and 56. The row and column for erase are selected by the memory control circuit 200 in response to a received address. The selection to erase may be made in response to a logic low value of a received data input.

Figure 1:
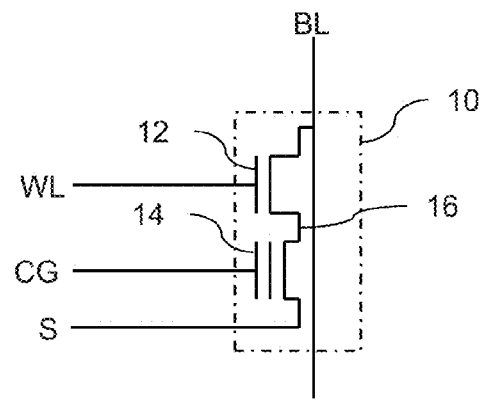
FIG. 1 is a schematic diagram of a prior art EEPROM cell.
Figure 2:
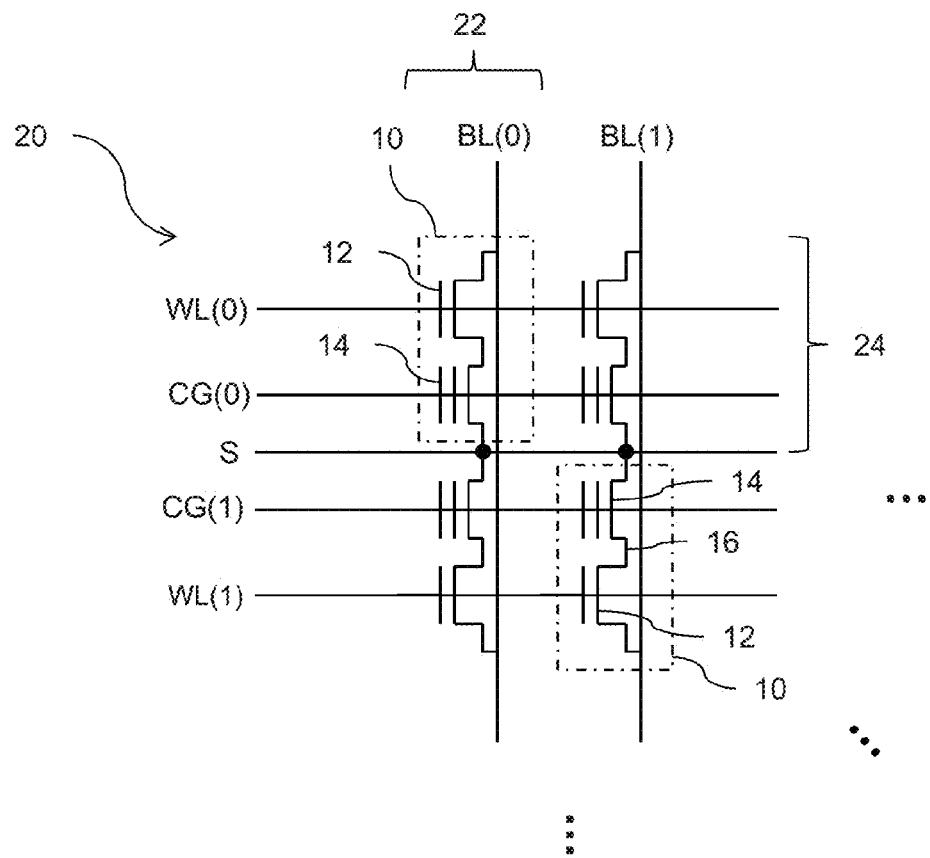
FIG. 2 is a schematic diagram of a prior art EEPROM memory architecture using the cell of FIG. 1.

In connection with the erase mode of operation, the embodiment described above operates in a manner analogous to that of the prior art EEPROM cell 10 (see, FIG. 1).

Operation of the memory 70 to program the cell 50 in a program mode of memory operation is as follows: a high program voltage (for example, 16V) is applied by the control circuit 200 to the word line WL of the row 74 where the selected memory cell 50 is located for application to the select transistors 52 and 58; the memory control circuit 200 further causes the bit line BL and complementary bit line BLC of the column 72 where the selected memory cell 50 is located to be driven to a high voltage level (for example, 13V); a low voltage (for example, zero volts) is applied by the memory control circuit 200 to the control gate CG line of the row 74 where the selected memory cell 50 is located for application to the floating gate transistors 54 and 56. The row and column for program are selected by the memory control circuit 200 in response to the received address. The selection to program may be made in response to a logic high value of the received data input.

In connection with the program mode of operation, it will be noted that the memory cell 50 does not have a source node (see, reference S, FIG. 1) as in prior art EEPROM cells 10. Thus, there is no need in the embodiment described above to generate a source pre-charge signal, and there is no risk of incorrect operation due to an un-optimized source pre-charge operation.

Operation of the memory 70 to read the cell 50 in a read mode of memory operation is as follows: a voltage sufficient to turn on the select transistors 52 and 58 (for example, 1-5V) is applied by a memory control circuit 200 to the word line WL of the row 74 where the selected memory cell 50 is located; the memory control circuit further causes the bit line BL of the column 72 where the selected memory cell 50 is located to be coupled to a low reference voltage (for example, zero volts); the memory control circuit further causes the complementary bit line BLC of the column 72 where the selected memory cell 50 is located to be coupled to the input of a sense amplifier circuit (reference 202, FIGS. 8-9); an intermediate read voltage (for example, 1.4V) is applied by the control circuit 200 to the control gate CG of the row 74 where the selected memory cell 50 is located for application to the floating gate transistors 54 and 56. The row and column for read are selected by the memory control circuit 200 in response to the received address. Then read data from the memory are output from the sense amplifier 202 as the data output signal.

In connection with the read mode of operation, the connection of the bit line BL to the low reference voltage positions the bit line BL to act in a manner analogous to the source node (see, reference 16, FIG. 1) of prior art EEPROM cells 10. Thus, the electrical path between the read bit line (in this configuration, the complementary bit line BLC coupled to the sense amplifier) and the low (for example, ground) reference voltage passes through select transistor 58, floating gate transistor 56, floating gate transistor 54 and select transistor 52.

Figure 5:
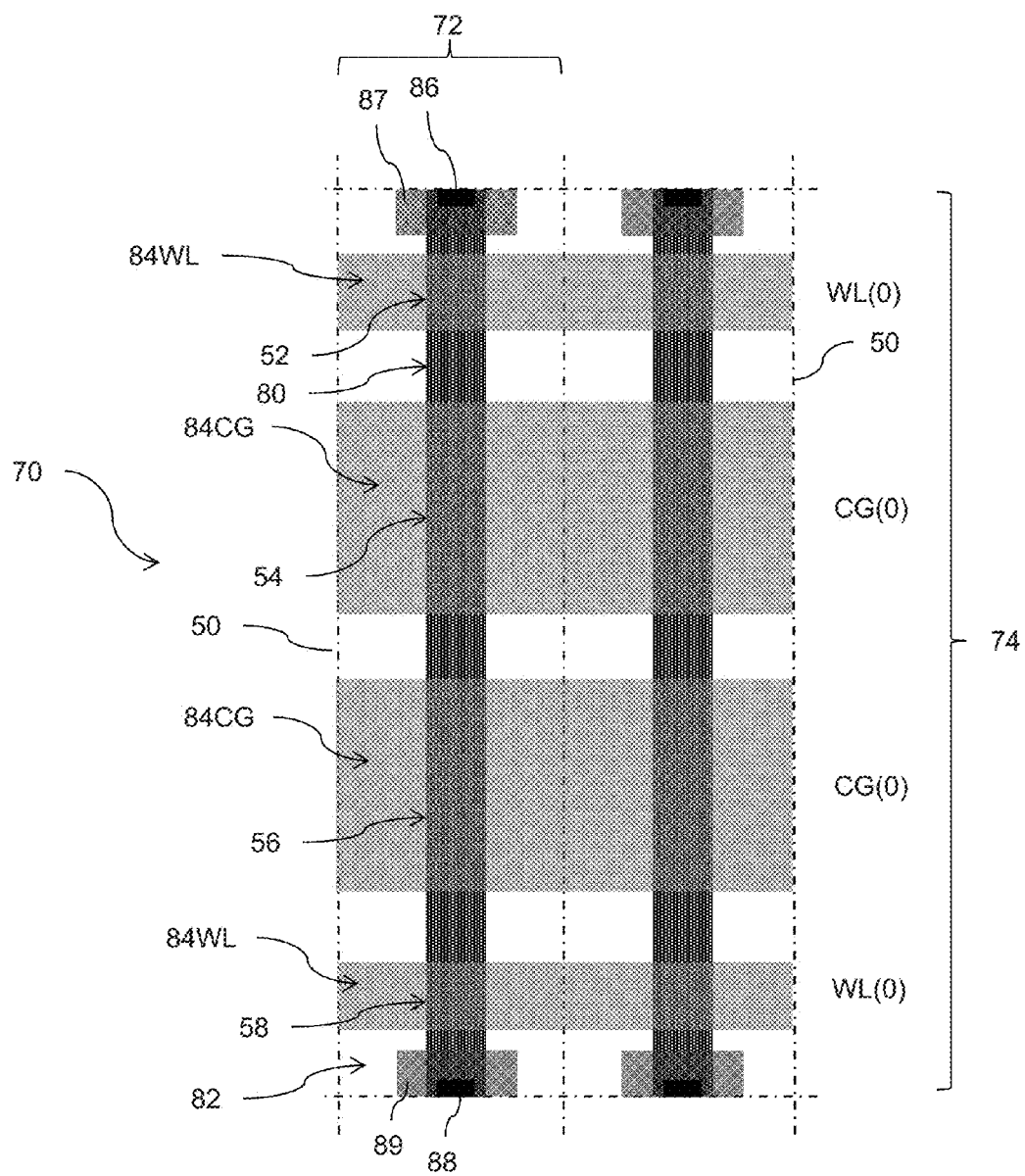
FIG. 5 is an integrated circuit plan layout at the substrate, polysilicon layers and metallization 1 level for the circuitry of the memory shown in FIG. 4.

Reference is now made to FIG. 5 showing an integrated circuit plan layout at the substrate, polysilicon and metallization 1 layers for the top half of the circuitry of the memory 70 shown in FIG. 4. Each cell 50 includes a diffusion region 80 provided in the substrate 82 for forming the sources, channels and drains of the transistors 52-58. The gates of the transistors 52-58 are provided by polysilicon lines 84 extending perpendicular to the diffusion region 80. In this embodiment, the polysilicon lines 84 are not only for the transistor gates, but also extend across the substrate 82. The polysilicon lines 84WL are coupled together (for example, at a periphery of the memory array) to form the word line WL for the row 74, and the polysilicon lines 84CG are coupled together (for example, at a periphery of the memory array) to form the control gate CG line for the row 74. At one end of the diffusion region 80 in each cell 50, a metal contact structure 86 is provided on the surface of the substrate to make contact to the first conduction node of transistor 52 (for the purpose of supporting connection to the bit line BL). At the other end of the diffusion region 80 in each cell 50, a metal contact structure 88 is provided on the surface of the substrate to make contact to the second conduction node of transistor 58 (for the purpose of supporting connection to the complementary bit line BLC). The metallization level 1 for the circuitry of the memory cell includes a first metal line 87 that is electrically connected to the metal contact structure 86 in each column and a second metal line 89 that is electrically connected to the metal contact structure 88 in each column.

Figure 6:
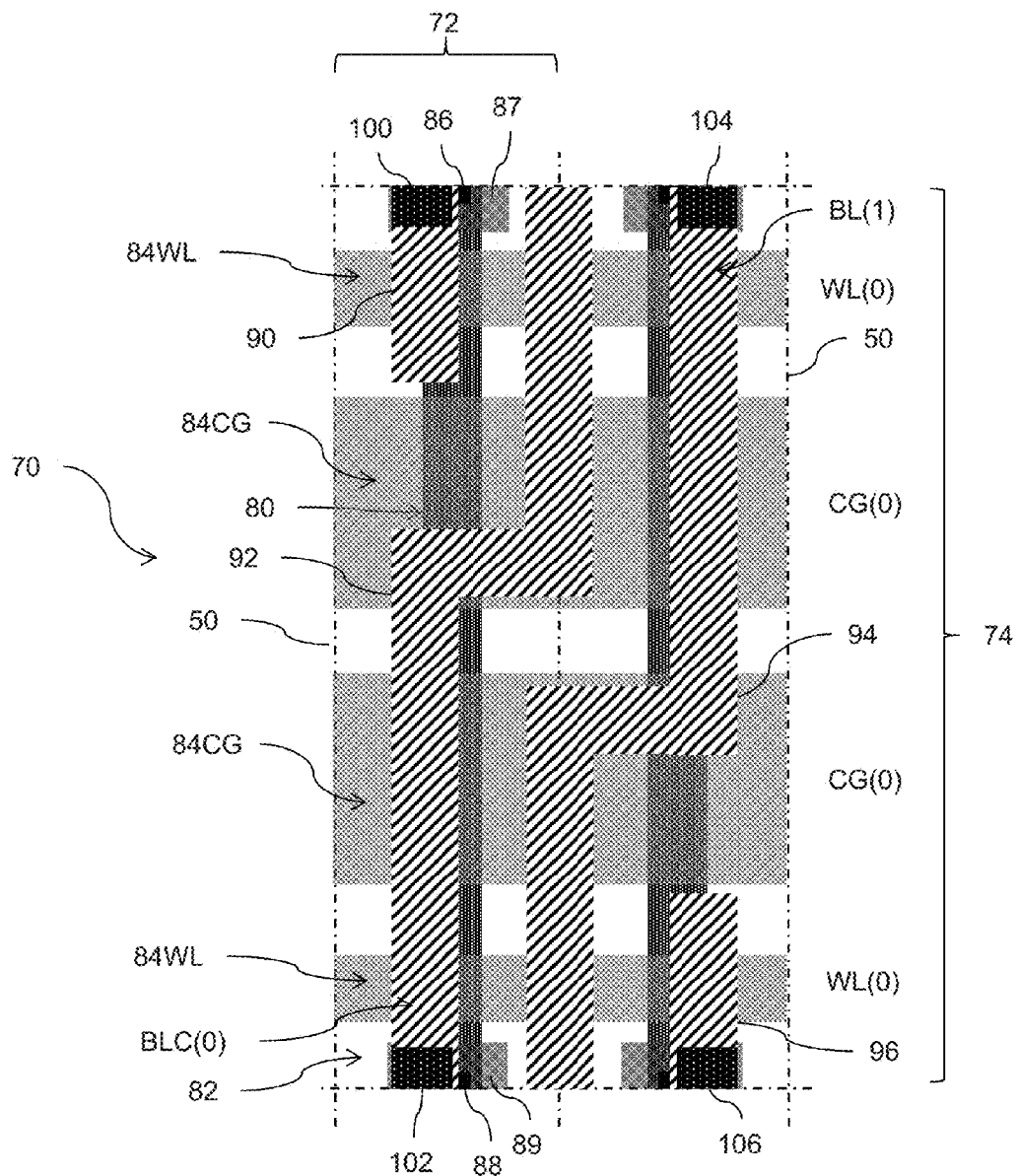
FIG. 6 is an integrated circuit plan layout further showing metal material at the metallization level 2 for the circuitry of the memory shown in FIG. 4.

Reference is now made to FIG. 6 further showing the integrated circuit plan layout for metal material at metallization level 2 for the circuitry of the memory shown in FIG. 4. The metallization level 2 includes a third metal line 90 that is electrically connected through a via 100 to the first metal line 87 and metal contact structure 86 in a first column.

The metallization level 2 further includes a fourth metal line 92 that is electrically connected through a via 102 to the second metal line 89 and metal contact structure 88 in the first column. This metal line 92 forms the complementary bit line BLC(0) for the first column. The metal line 92 extends parallel to the diffusion region 80 to pass between the metal contact structures 86 and metal lines 87 for adjacent columns.

The metallization level 2 further includes a fifth metal line 94 that is electrically connected through a via 104 to the first metal line 87 and metal contact structure 86 in a second column (adjacent the first column). This metal line 94 forms the bit line BL(1) for the second column. The metal line 94 extends parallel to the diffusion region 80 to pass between the metal contact structures 88 and metal lines 89 for adjacent columns.

The metallization level 2 still further includes a sixth metal line 96 that is electrically connected through a via 106 to the second metal line 89 and metal contact structure 88 in the second column.

Figure 7:
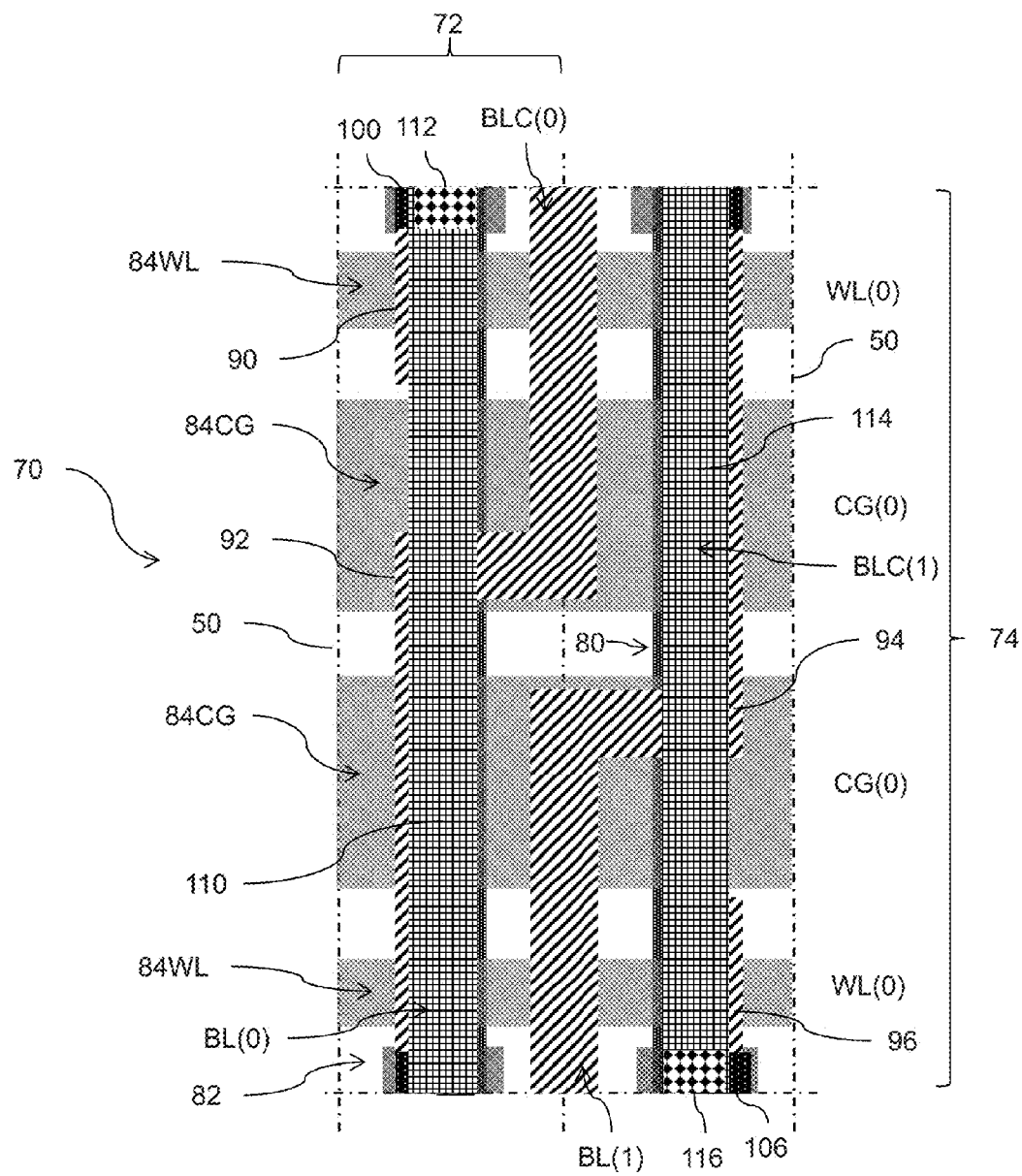
FIG. 7 is an integrated circuit plan layout further showing metal material at metallization level 3 for the circuitry of the memory shown in FIG. 4.

Reference is now made to FIG. 7 further showing the integrated circuit plan layout for metal material at metallization level 3 for the circuitry of the memory shown in FIG. 4. The metallization level 3 includes a seventh metal line 110 electrically connected to the metal line 90 by means of a via 112. This metal line 110 forms the bit line BL(0) for the first column. The metal line 110 extends parallel to the diffusion region 80 to pass over the metal line 92 for the complementary bit line BLC(0) in the first column.

The metallization level 3 includes an eighth metal line 114 electrically connected to the metal line 96 by means of a via 116. This metal line 114 forms the complementary bit line BLC(1) for the second column. The metal line 114 extends parallel to the diffusion region 80 to pass over the metal line 94 for the bit line BL(1) in the second column.

To form a large size memory, the plan layout for the cells 50 is replicated and tiled across the array in a manner well known to those skilled in art.

It is noted that, at least because the cell 50 does not require the presence of the source node and its associated source line (which in a prior art layout would extend parallel to the polysilicon lines), the cell 50 can be designed to occupy less space than a prior art architecture utilizing redundant cells. This is because the Y direction distance between adjacent control gate polysilicon lines for paired redundant floating gate transistors 54 and 56 is set by the minimum polysilicon line spacing set by the process node (rather than the dimension of the contact plus two times the contact to gate distance as in prior art architectures).

It is further noted that the cell 50 can be designed to occupy less space than a prior art architecture utilizing redundant cells because the two select transistors 52 and 58 can be shorter in length. Those skilled in the art understand that the minimum length of a select (switching) transistor is mainly imposed by the off current in read operation mode. In the embodiment of cell 50, the transistors 52 and 58 are coupled in series, this permits a design of each transistor to have about one-half the minimum length as the transistors 52 and 58 together will meet the minimum length criteria. The selectivity of the transistors during the program cycle is not affected due to body effect.

The embodiment of the memory 70 including cells 50 presents a further advantage over prior art architectures in that peripheral circuitry (for example, including the control circuitry) is simplified because there is no need in the memory 70 to manage source line pre-charge. Furthermore, because there is no source node and associated source line for the memory cells 50, there is no reliability potential risk (it being understood here that source capacitance is about zero).

Figure 8:
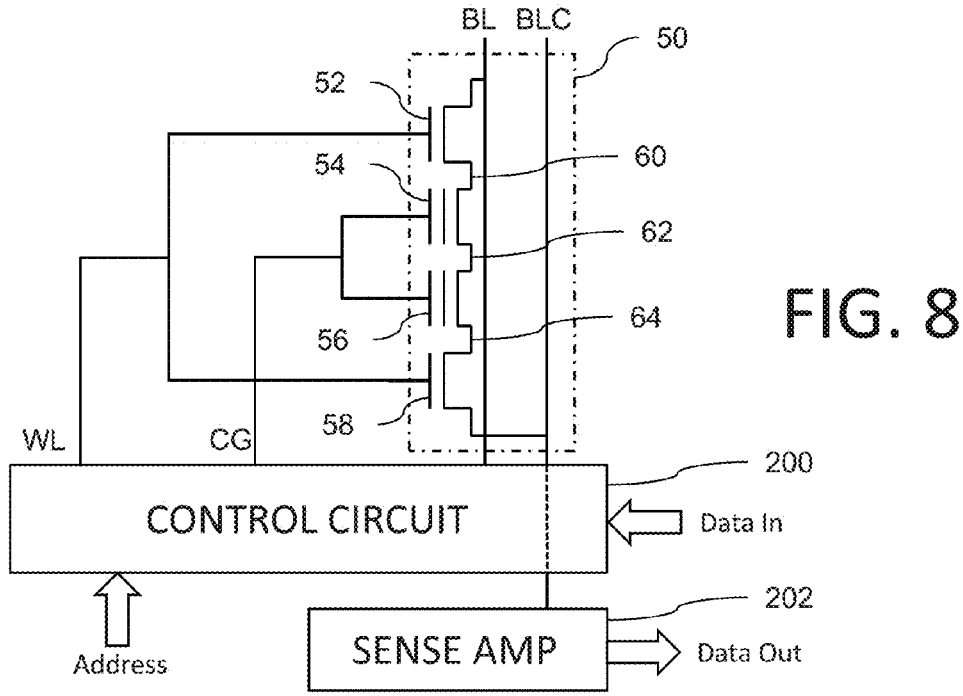
FIGS. 8 and 9 illustrate connection of control and sense amplification circuitry for the memory of FIG. 4.
Figure 9:
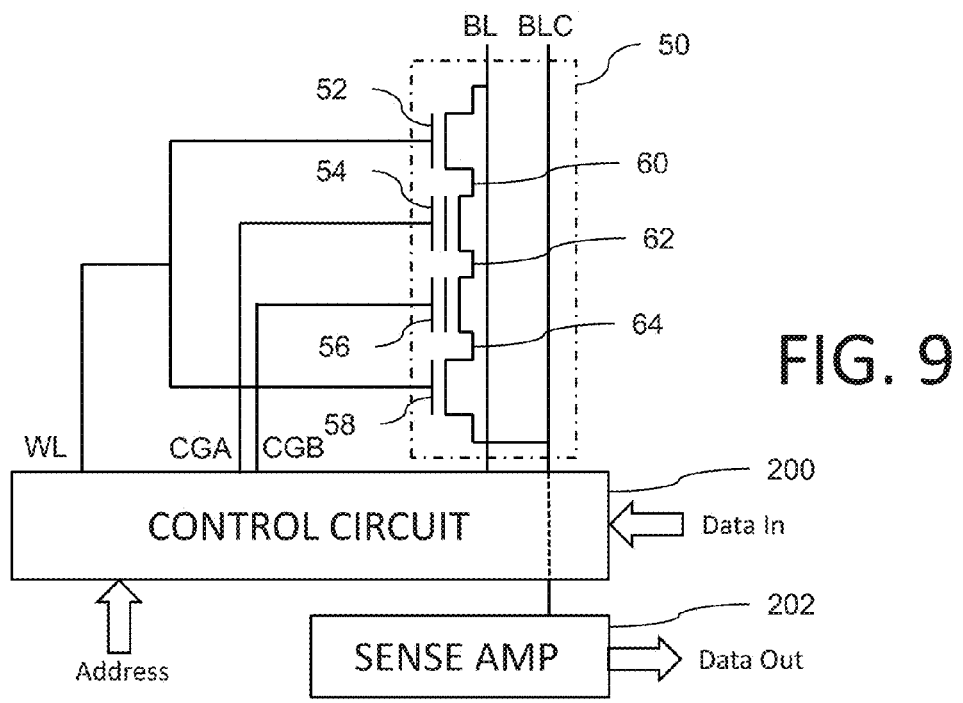

Reference is now made to FIG. 9 which illustrates an alternative configuration for connection of the control circuit 200 to the memory cell 50. The circuit of FIG. 9 differs from the circuit of FIG. 8 in that the control circuit 200 is configured to exercise separate gate control over the floating gate transistors 54 and 56. Rather than have both transistors 54 and 56 actuated in response to the signal on the control gate (CG) line, the implementation of FIG. 9 includes a first control gate (CGA) line and second control gate (CGB) line coupled to the gate terminals of the transistors 54 and 56, respectively.

The implementation of FIG. 9 supports a test feature operation of the memory cell 50 permitting checking of whether one or the other of the transistors 54 and 56 is defective. This testing operation can be performed at production of the memory or during field use of the memory.

The testing operation includes the followings steps: a) erase the memory cell 50 (as described above); b) perform a first read forcing in an "on" state for transistor 54 by: b1) setting the first control gate (CGA) for transistor 54 to a higher voltage than in the normal read operation (for example by having the control circuit 200 drive the first control gate line to 4V instead of 1.5V as for normal read mode), b2) setting the second control gate (CGB) for transistor 56 to a normal read mode voltage (for example, 1.5V), and b3) check the conduction (charge retention state) of the transistor 56 by read out through the sense amp 202; and c) perform a second read forcing in an "on" state for transistor 56 by: b1) setting the second control gate (CGB) for transistor 56 to a higher voltage than in the normal read operation (for example by having the control circuit 200 drive the first control gate line to 4V instead of 1.5V as for normal read mode), b2) setting the first control gate (CGA) for transistor 54 to a normal read mode voltage (for example, 1.5V), and b3) check the conduction (charge retention state) of the transistor 54 by read out through sense amp 202.

In order to support the circuit configuration of FIG. 9, at the physical layout level for the memory the polysilicon lines for the control gates CG in each row are physically separate as shown in FIG. 5. Outside of the array, the control gate lines may be connected using circuitry of the control circuit 200 to support the configuration and operation as shown in FIG. 8 as well as the configuration and operation as shown in FIG. 9. Thus, the control circuit 200 would be able to generate a same voltage for application to both CGA and CGB lines in a normal mode of operation for the memory and further be able to generate separate voltages for application to the CGA and CGB lines for the testing operation.

With the series connection of the transistors 52-58 in each cell 50, those skilled in the art will note that error correction of with respect to one of the floating gate/select transistor pairs (52/54 or 56/58) in cell 50 requires application of proper read parameters on the control gate CG line as well as the read current in the source-drain paths so that one transistor pair having a retention-faulty floating gate transistor must draw current in order to allow the sensing of the other transistor pair.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit, comprising:
a first bit line;
a second bit line; and
a first memory cell configured to store a single data bit, comprising:
 a first select transistor;
 a second select transistor;
 a first floating gate transistor having a first source node and configured for storing said single data bit; and
 a second floating gate transistor having a second source node and configured for storing said single data bit;
wherein source-drain paths of the first and second select transistors and the first and second floating gate transistors are coupled in series with each other between the first bit line and the second bit line, wherein said first and second source nodes are directly connected to each other but not connected to any other circuit;
wherein gate terminals of the first and second select transistors are connected to a same first word line for the first memory cell.

2. The integrated circuit of claim 1, wherein gate terminals of the first and second floating gate transistors are connected to a same control gate line for the first memory cell.

3. The integrated circuit of claim 2, further comprising a control circuit coupled to the word line, the control gate line, the first bit line and the second bit line, said control circuit configured to perform read, erase and program operations on the first memory cell.

4. The integrated circuit of claim 1, further comprising:
a second memory cell, comprising:
 a third select transistor;
 a fourth select transistor;
 a third floating gate transistor having a third source node; and
 a fourth floating gate transistor having a fourth source node;
wherein source-drain paths of the third and fourth select transistors and the third and fourth floating gate transistors are coupled in series with each other between the first bit line and the second bit line, with said third and fourth source nodes are directly connected to each other but not connected to any other circuit.

5. The integrated circuit of claim 4,
wherein gate terminals of the first and second select transistors are connected to said same first word line for the first memory cell;
wherein gate terminals of the third and fourth select transistors are connected to a same second word line for the second memory cell;
wherein gate terminals of the first and second floating gate transistors are connected to a first control gate line for the first memory cell; and
wherein gate terminals of the third and fourth floating gate transistors are connected to a second control gate line for the second memory cell.

6. The integrated circuit of claim 1, further comprising:
a third bit line;
a fourth bit line; and
a second memory cell, comprising:
 a third select transistor;
 a fourth select transistor;
 a third floating gate transistor having a third source node; and
 a fourth floating gate transistor having a fourth source node;
wherein source-drain paths of the third and fourth select transistors and the third and fourth floating gate transistors are coupled in series with each other between the third bit line and the fourth bit line, with said third and fourth source nodes are directly connected to each other but not connected to any other circuit.

7. The integrated circuit of claim 6,
wherein gate terminals of the first, second, third and fourth select transistors are connected to said same first word line; and
wherein gate terminals of the first, second, third and fourth floating gate transistors are connected to a same control gate line for the first and second memory cells.

8. The integrated circuit of claim 1, further comprising:
a substrate;
a diffusion region formed in the substrate to support the series coupled source-drain paths of the first and second select transistors and first and second floating gate transistors;
a plurality of polysilicon regions formed on top of the substrate to form gate terminals of the first and second select transistors and first and second floating gate transistors.

9. The integrated circuit of claim 8, wherein the polysilicon regions extend perpendicular to the diffusion region.

10. The integrated circuit of claim 8, further comprising:
a first metal contact with the diffusion region at a first end of the series coupled source-drain paths; and
a second metal contact with the diffusion region at a second end of the series coupled source-drain paths.

11. The integrated circuit of claim 10, further comprising a metallization level over the substrate including a first metallization line in electrical contact with the first metal contact and defining the first bit line.

12. The integrated circuit of claim 11, further comprising an additional metallization level including a second metallization line in electrical contact with the second metal contact and defining the second bit line.

13. The integrated circuit of claim 12, wherein the first and second metallization lines extend parallel to the diffusion region.

14. The integrated circuit of claim 12, wherein the second metallization line extends over, without contacting, the first metal contact.

15. The integrated circuit of claim 12, wherein the second metallization line extends over the first metallization line.

16. The integrated circuit of claim 11, wherein the first metallization line passes around, without contacting, the second metal contact.

17. The integrated circuit of claim 1, further comprising a control circuit coupled to the first bit line and second bit line, said control circuit configured to couple the first bit line to a reference voltage and couple the second bit line to a sense amplifier during a read operation on the first memory cell.

18. The integrated circuit of claim 1, wherein gate terminals of the first and second floating gate transistors are connected to first and second control gate lines, respectively, for the first memory cell.

19. The integrated circuit of claim 18, further comprising a control circuit coupled to the word line, the first and second control gate lines, the first bit line and the second bit line, said control circuit configured to perform read, erase, program and test operations on the first memory cell.

20. The integrated circuit of claim 19, wherein during the test operation the control circuit applies a different control voltage to the first and second control gate lines and separately senses a charge retention state of each of the first and second floating gate transistors.

21. An integrated circuit, comprising:
a non-volatile memory including a plurality of memory cells arranged in an array with rows and columns;
wherein each column includes a first bit line and a second bit line; and
wherein each memory cell comprises:
a first select transistor with a first source-drain path;
a first floating gate transistor with a second source-drain path series connected to the first source-drain path at a first node;
a second floating gate transistor with a third source-drain path series connected to the second source-drain path at a second node; and
a second select transistor with a fourth source-drain path series connected to the third source-drain path at a third node;
wherein the first, second, third and fourth source-drain paths are coupled in series between the first bit line and the second bit line;
wherein each row includes a word line;
wherein the word line for each row is coupled to the gate terminals of the first and second select transistors of each memory cell in that row; and
wherein there is no source control signal applied to said second node from external to said memory cell during any mode of operation of said memory cell.

22. The integrated circuit of claim 21, wherein each row includes a control gate line, and wherein the control gate line is coupled to gate terminals of the first and second floating gate transistors of each memory cell in that row.

23. The integrated circuit of claim 21, further comprising a control circuit coupled to the word lines, the control gate lines, the first bit lines and the second bit lines, said control circuit configured to perform read, erase and program operations on the plurality of memory cells.

24. The integrated circuit of claim 23, further comprising a sense amplifier circuit, wherein said control circuit is configured, when performing the read operation on said each memory cell, to couple the first bit line to a reference voltage and couple the second bit line to the sense amplifier circuit.

25. The integrated circuit of claim 21, further comprising:
a substrate;
a diffusion region formed in the substrate to support each of the series coupled first, second, third and fourth source-drain paths;
a plurality of polysilicon regions formed on top of the substrate to form gate terminals of the first and second select transistors and the first and second floating gate transistors.

26. The integrated circuit of claim 25, further comprising:
a first metal contact with the diffusion region at a first end of the series coupled source-drain paths;
a second metal contact with the diffusion region at a second end of the series coupled source-drain paths;
a metallization level over the substrate including a first metallization line in electrical contact with the first metal contact and defining the first bit line for one column; and
an additional metallization level including a second metallization line in electrical contact with the second metal contact and defining the second bit line for said one column.

27. The integrated circuit of claim 26, wherein the first and second metallization lines extend parallel to the diffusion region, and wherein the polysilicon regions extend perpendicular to the diffusion region.

28. The integrated circuit of claim 26, wherein the first metallization line passes around, without contacting, the second metal contact, and wherein the second metallization line extends over, without contacting, the first metal contact.

29. The integrated circuit of claim 26, wherein the second metallization line extends over the first metallization line.

30. The integrated circuit of claim 21, wherein each row includes a first control gate line and a second control gate line, and wherein the first control gate line is coupled to a gate terminal of the first floating gate transistors of each memory cell in the row and wherein the second control gate line is coupled to a gate terminal of the second floating gate transistors of each memory cell in the row.

31. The integrated circuit of claim 30, further comprising a control circuit coupled to the word line, the first control gate line and the second control gate line, the control circuit configured to apply different control voltages to the first and second control gate lines so as to separately sense a charge retention state of each of the first and second floating gate transistors.

* * * * *